United States Patent [19]

Beilstein, Jr. et al.

[11] Patent Number: 5,714,039
[45] Date of Patent: Feb. 3, 1998

[54] METHOD FOR MAKING SUB-LITHOGRAPHIC IMAGES BY ETCHING THE INTERSECTION OF TWO SPACERS

[75] Inventors: Kenneth E. Beilstein, Jr.; Claude L. Bertin; James M. Leas, all of Chittenden County, Vt.; Jack A. Mandelman, Dutchess County, N.Y.

[73] Assignee: International Business Machines Corporation, Armonk, N.Y.

[21] Appl. No.: 539,244

[22] Filed: Oct. 4, 1995

[51] Int. Cl.⁶ .................................................. H01L 21/3105
[52] U.S. Cl. ...................... 156/657.1; 156/656.1; 216/58; 216/72; 216/83; 437/228
[58] Field of Search ......................... 156/655.1, 656.1, 156/657.1; 216/2, 58, 72, 83; 437/52, 60, 919, 40, 41, 43, 228

[56] References Cited

U.S. PATENT DOCUMENTS

| | | | |
|---|---|---|---|
| 4,209,349 | 6/1980 | Ho et al. | 148/187 |
| 4,256,514 | 3/1981 | Pogge | 148/1.5 |
| 4,326,332 | 4/1982 | Kenney | 29/571 |
| 4,878,996 | 11/1989 | Mitchell et al. | 156/653.1 |
| 5,013,680 | 5/1991 | Lowrey et al. | 437/52 |
| 5,055,898 | 10/1991 | Beilstein, Jr. et al. | 357/23.6 |
| 5,120,675 | 6/1992 | Pollack | 437/67 |

OTHER PUBLICATIONS

Miller, "High Density, Planar Metal Lands" IBM Tech. Discl. Bull. vol. 23, No. 6, pp. 2270–2276, Nov. 1980.
Trump, "Process for Structuring a Submicron Mask", IBM Technical Disclosure Bulletin, V27 N5, Oct. 1984, pp. 3090–3091.
Barson, et al., "High Density Planar Metal Lands", IBM Technical Disclosure Bulletin, V24 N2, Jul. 1981, pp. 1296–1299.

*Primary Examiner*—R. Bruce Breneman
*Assistant Examiner*—Anita Alanko
*Attorney, Agent, or Firm*—Whitham, Curtis, Whitham & McGinn; Howard J. Walter, Jr.

[57] ABSTRACT

A method of forming a sub-lithographic image formed by the intersection of two spacers. A substrate with a first pattern of selectively etchable material with sidewalls that are substantially vertical is provided. A first sidewall spacer is formed of a material that is selectively etchable relative to the first pattern material. A second pattern of a selectively etchable material is formed with the second pattern intersecting the first pattern. The sidewalls of the second pattern are substantially vertical as well. A second sidewall spacer is formed of a material that is selectively etchable relative to the second pattern material. The second pattern material is etched to leave the second sidewall spacer. Alternatively, the first and/or second pattern materials may be totally removed, left in place, or planarized.

11 Claims, 2 Drawing Sheets

METHOD FOR MAKING SUB-LITHOGRAPHIC IMAGES BY ETCHING THE INTERSECTION OF TWO SPACERS

BACKGROUND OF THE INVENTION

1. Field of the Invention

The present invention generally relates to a method of making sub-lithographic elements, and, more particularly, to a method of achieving a minimum size image formed by the intersection of two spacers.

2. Description of the Related Art

One of the challenges to achieving higher levels of integration in semiconductor manufacturing is the patterning of smaller and smaller images. If the smallest images on a die are lithographically determined, the number of devices or circuits that can be placed in a given area is roughly inversely proportional to the square of the minimum lithographic dimension.

Since the fabrication cost of a region of silicon is not strongly related to the size of the minimum geometry in that region, it is prudent to package as many circuits in a given area as possible while maintaining a reasonable manufacturing yield to minimize circuit cost.

Some have developed procedures to produce sub-lithographic images, thereby allowing more dense integration with a concomitant reduction in per circuit costs. For example, U.S. Pat. No. 4,256,514, describes a method for forming sidewall spacers for fabricating sub-lithographic images consisting of narrow lines.

While useful for many applications, such sidewall image transfer (SIT) procedures typically produce an image that is sub-lithographic along one dimension only, usually the width of the image. Such one dimensional sub-lithographic procedures, however, are ineffective for applications that seek smaller contact regions, which require small, sub-lithographic geometries in two dimensions.

In light of the foregoing, there exists a need for a method to achieve images that have sub-lithographic dimensions along two axes.

SUMMARY OF THE INVENTION

The present invention is directed to method of forming sub-lithographic images formed by the intersection of two spacers, which substantially obviates one or more of the problems due to the limitations and disadvantages of the related art.

The present method may be employed for any structure that uses an array of contacts, posts, holes, or bumps where density or image size are important. Possible applications include dynamic and static random access memory (DRAM/SRAM) arrays, other integrated circuit arrays, or liquid crystal displays.

In addition, the present method may be employed for any structure that requires sub-optical patterns for optical and sub-optical interactions. Typical applications would include diffraction gratings, structures to generate moire patterns, and optical and sub-optical filters for optical processing.

In general, a first spacer having a first width is formed along a first pattern material. Over the first pattern and first spacer there is formed a second pattern material with a second sidewall spacer having a second width, the second pattern material intersecting the first pattern material at an angle that is typically 90 degrees. The first spacer may then be etched everywhere except where it is masked by the second spacer. The resulting structure is sub-lithographically dimensioned along two axes.

To achieve these and other advantages and in accordance with the purpose of the invention, as embodied and broadly described, the invention provides for a method of forming a sub-lithographic image on a substrate comprising the steps of: (1) providing a first pattern of selectively etchable material on the substrate, the first pattern material having sidewalls that are substantially vertical; (2) forming a first sidewall spacer on the substantially vertical sidewalls of the first pattern material, the first sidewall spacer being of a material that is selectively etchable relative to the first pattern material; (3) forming a second pattern of a selectively etchable material having sidewalls that are substantially vertical, wherein the second pattern must intersect the first pattern; (4) forming a second sidewall spacer on the substantially vertical sidewalls of the second pattern material, the second sidewall spacer being of a material that is selectively etchable relative to the second pattern material; and (5) etching the second pattern material to leave the remaining second sidewall spacer.

In another aspect, additional method steps would include planarizing the surface after forming the first sidewall spacer, wherein the planarizing material can be etched selective to the first sidewall spacer.

In still other aspects, depending on the particular way in which the sub-lithographic structure will be used in the overall device, the first and/or second pattern materials may be totally removed, left in place, or planarized.

In still another aspect, the invention provides for a semiconductor device structure for forming a sub-lithographic image on a substrate, comprising a first pattern of selectively etchable material on the substrate, the first pattern material having sidewalls that are substantially vertical; a first sidewall spacer formed outwardly of the substantially vertical sidewalls of the first pattern material, the first sidewall spacer being of a material that is selectively etchable relative to the first pattern material; a second pattern of a selectively etchable material having sidewalls that are substantially vertical, wherein the second pattern intersects the first pattern; and a second sidewall spacer formed outwardly of the substantially vertical sidewalls of the second pattern material, the second sidewall spacer being of a material that is selectively etchable relative to the second pattern material.

It is to be understood that both the foregoing general description and the following detailed description are exemplary and explanatory and are intended to provide further explanation of the invention as claimed.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

It would be understood by those skilled in the art that the method of the present invention—forming sub-lithographic images determined by the intersection of two spacers—may be used in a wide variety of integrated circuit applications. For discussion and illustrative purposes, the method of the present invention is described with respect to a Dynamic Random Access Memory (DRAM) cell, as described, for example, in U.S. Pat. No. 5,055,898. The discussion of the DRAM cell is not meant to limit the breadth of the present inventive method, but is merely provided to show one application of the inventive process.

Accordingly, it is understood that various conventional deposition, masking, etching, and process techniques may be used to form a particular semiconductor device, and still be within the scope and practice of the present invention.

As stated above, the present method may be employed for any structure that uses an array of contacts, holes, bumps, or posts where density or image size are important.

Figure 1:
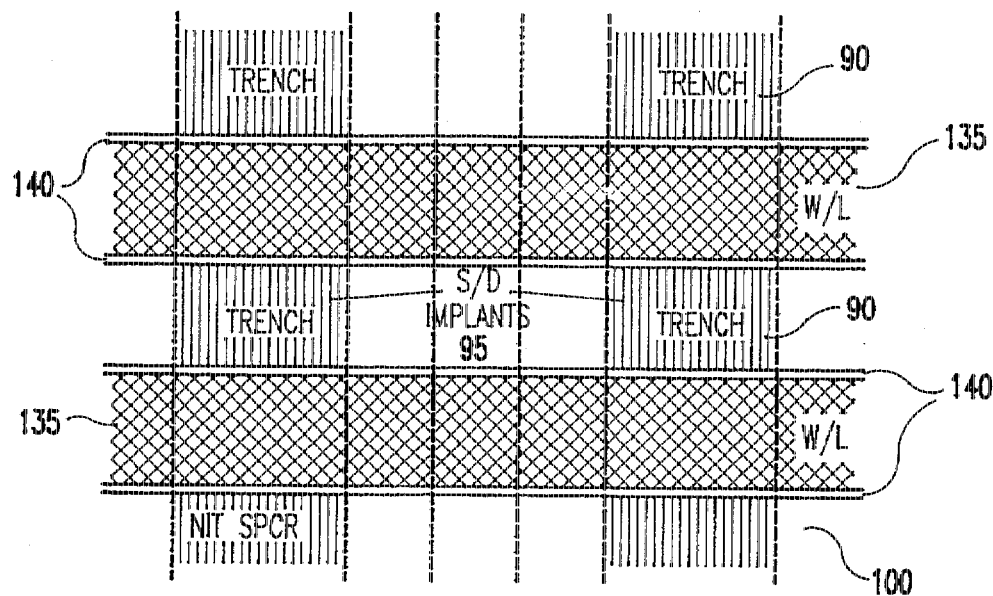
FIG. 1 is a top view of a device usable with the method of the present invention.

Referring now to the drawings, and more particularly to FIG. 1, there is shown an exemplary top view of a DRAM device. Using suitable masking techniques and anisotropic reactive ion etching (RIE), trenches 90 are etched into a silicon substrate 100 to a desired length, depth, and width, depending on the desired performance characteristics of the resulting device. A dielectric such as oxide-nitride-oxide is deposited, approximately 10 nanometers thick. These trenches 90 are then filled with a gate polysilicon to form the storage capacitor.

A first pattern material, forming conventional wordlines (W/L) for example, is provided consisting of polysilicon 135 (or other gate conductor). A layer of nitride is then deposited and directionally etched to form nitride spacers 140 along each of the wordline 135 edges.

A suitable dopant (e.g., boron or phosphorous depending on the type of device) may then be ion implanted to form the source and drain regions 95, self-aligned to the nitride spacers 140 on the wordline edge. The dopant is activated using standard annealing techniques to diffuse the dopant under the nitride spacer 140 and gate edge.

Figure 2:
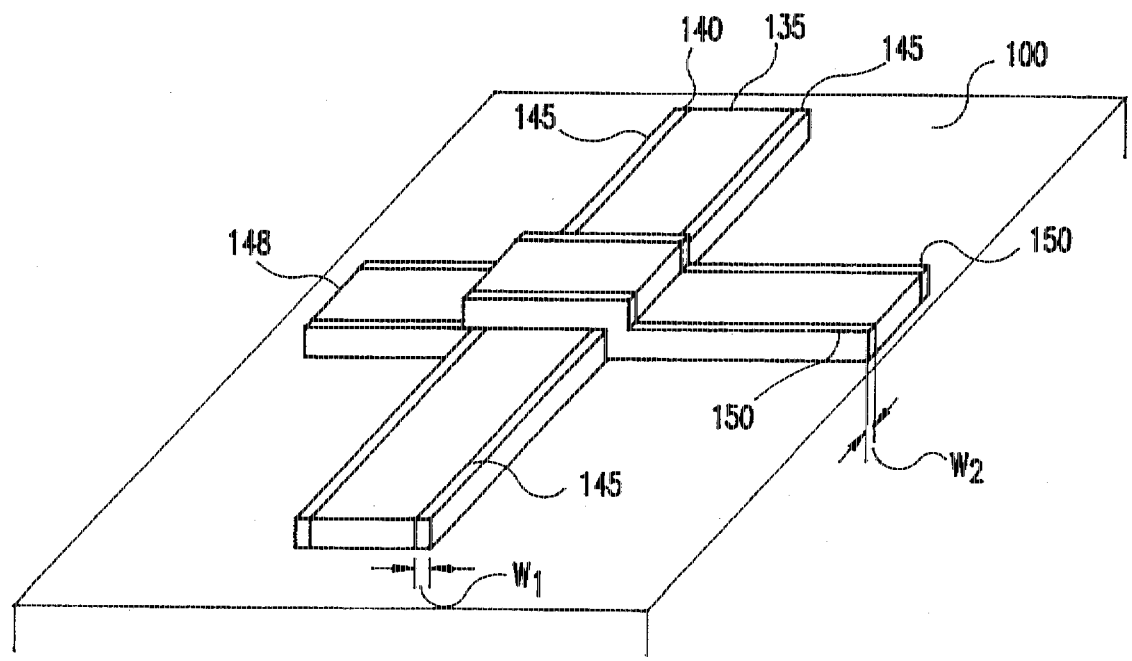
FIG. 2 is a simplified perspective view of the device of FIG. 1 showing the intersection of first and second pattern materials.

FIG. 2 is a simplified perspective view of the device of FIG. 1 with the first pattern material or wordline 135 shown formed on the substrate 100. As shown in FIG. 2, a sacrificial spacer 145 is formed outwardly of the nitride spacers 140 (for clarity, the thickness of the nitride spacers 140 on the wordline edges are not shown in FIG. 2). Note for now that the width '$w_1$' of the spacer 145 corresponds to the x-dimension in FIG. 3.

The sacrificial spacers 145 may be composed of BN (boron nitride), $Al_2O_3$ (aluminum trioxide), or other suitable material. What is important is that the sacrificial spacers 145 have different etch properties than silicon, oxide, and nitride since a portion of this sacrificial spacer 145 may later be removed selective to the silicon, oxide, and nitride materials that make up the device.

A second pattern material 148, sacrificial polysilicon for example, is then deposited over the device. A resist is applied and a mask is aligned so that a reactive ion etch (RIE) of the sacrificial polysilicon forms stripes 148 (only one of which is illustrated for clarity) perpendicular to the wordline 135. Although a perpendicular intersection may be preferred for most applications, the intersection of the wordline 135 and sacrificial polysilicon stripe 148 need not be perpendicular, and may be at any angle other than parallel.

Next, a layer of TEOS (tetraethylorthosilicate) or other suitable material is deposited and spacer etched to form TEOS spacers 150 on the edges of the sacrificial polysilicon stripe 148. The sacrificial polysilicon stripe 148 may then be RIE etched, leaving the TEOS spacers 150. Note that the width '$w_2$' of the spacer 150 corresponds to the y-dimension in FIG. 3.

Figure 3:
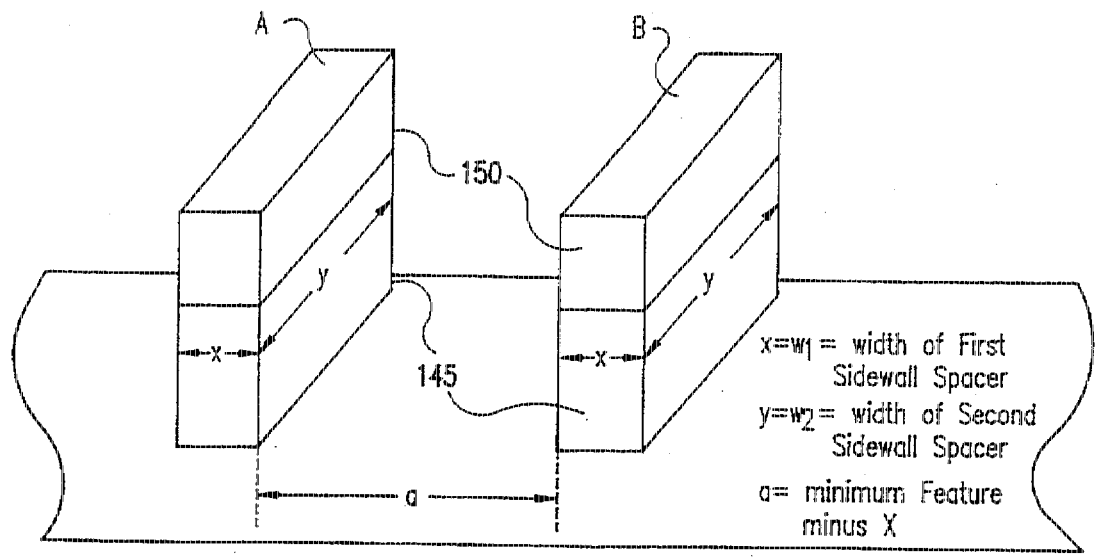
FIG. 3 is a perspective view showing the contacts formed by the intersection of the two spacers.

The BN (or $Al_2O_3$) spacers 145 on the edges of the wordline 135 are then RIE etched except where protected by the TEOS oxide spacers 150 to produce a sub-lithographic structure as shown in FIG. 3. FIG. 3 has been simplified (by removal of any pattern materials) and the x- and y-dimensions have been exaggerated to highlight that regions A and B are composed of spacers 145 and 150. Note that the TEOS layer 150 is actually a stripe passing over spacers 145.

Referring to FIG. 2, if the region outside of wordline 135 and spacers 140, 145 is not filled and planarized, subsequent deposition and formation of the TEOS spacers 150 will also form spacers on the BN spacers 145. This should not effect the end result, since suitable mask and etch steps could be utilized to achieve the desired spacer locations. If the region outside of wordline 135 and spacers 140, 145 is filled and planarized, then no spacers will be formed along existing spacer 145.

Figure 4:
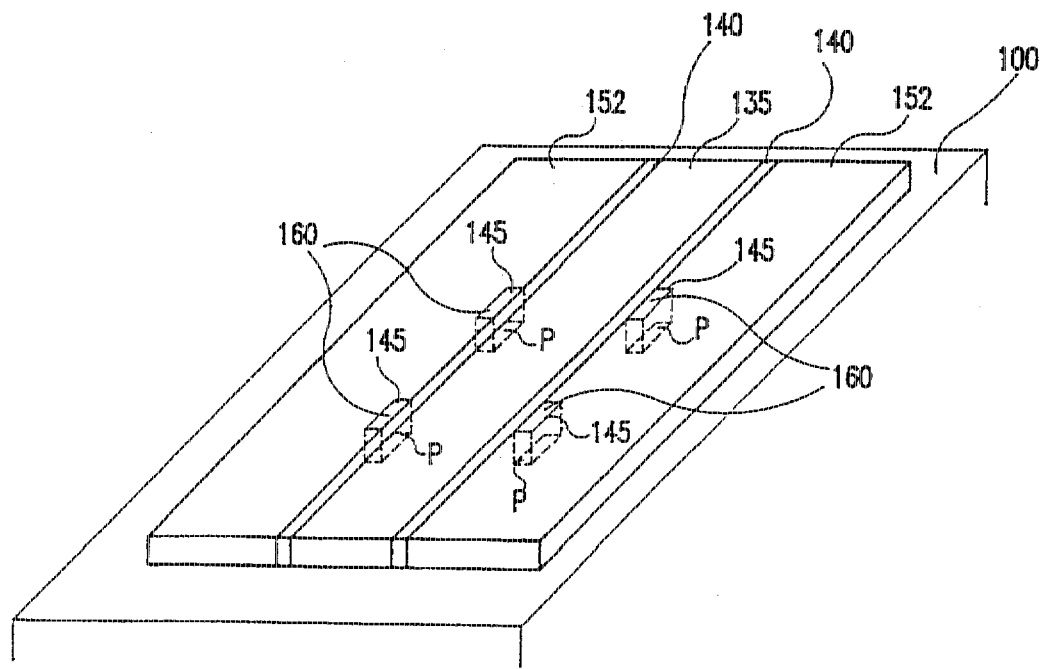
FIG. 4 is a simplified perspective view of the device of FIG. 2 showing the strap openings or posts formed by the method of the present invention.

In one process as shown in FIG. 4, the spaces between the wordlines, formed by the RIE etch of the polysilicon stripes 148, are filled with TEOS 152 and planarized, to the tops of the remaining BN spacers 145, thereby effectively removing the spacer material 150 from regions A and B. The remaining BN spacers may then be directionally etched to form strap openings 160. In the case of a DRAM cell, these resulting strap openings 160 will become the bitline and node contacts to the transistor using conventional DRAM completion processing techniques. The original nitride sidewall spacer 140 prevents the strap openings from shorting to the wordline 135 when the strap openings are filled with a conductor.

As shown in FIGS. 3 and 4, and in accordance with the method of the present invention, the BN spacers 145—that are later RIE etched out to form strap openings 160—have both their length and width determined by the intersection of two spacers 145 and 150. In other words, the strap openings 160 are spacer-sized in both dimensions ('x' and 'y') as a result of the interconnection of the first BN spacer 145 and the second TEOS spacer 150. By altering the widths $w_1$ and $w_2$ of the respective spacers 145 (BN spacers) and 150 (TEOS spacers), the 'x' and 'y' dimensions of the contact or strap openings may be infinitely adjusted to achieve the desired feature size.

Note that the first and second pattern materials are selectively etchable, and that the first and second sidewall spacers are selectively etchable relative to the respective first and second patterns. Accordingly, depending on the particular application for the two-dimensioned sub-lithographic structure, each of the four materials (i.e., first 135 and second 148 pattern materials, and first 145 and second 150 spacers) may be etched away or left in place to produce the desired two-dimensional sub-lithographic structure.

By way of example and not by limitation, let us assume that the first spacer material is made from a metallic material such as tungsten that can be conformally deposited. In accordance with the method of the present invention, a second pattern material and second spacer material would then be formed over the tungsten, followed by removal of the second pattern material, thereby leaving the second spacer material. The tungsten may then be etched using the second spacer material as a mask, and thereafter removing the second spacer material. Referring to FIG. 4, by depositing and then planarizing the TEOS 152, the strap openings 145 become tungsten contacts that were constructed directly from the first spacer material. This eliminates the need to fill the strap openings with conductive metal after etching out the first spacers (BN or aluminum oxide). In either case, with the tungsten spacer or the BN spacer, the contact is self-aligned to the wordline or whatever structure that was used to construct the spacer.

In still another alternative, if layer 152 was not deposited and layer 135 and its original nitride spacer 140 are removed, then one could construct tungsten metal posts P, as shown by the dashed lines in FIG. 4.

Alternatively, the first pattern material and first sidewall spacer may be planarized before forming the second pattern material. Likewise, a planarizing step may follow the formation of the second pattern material and second sidewall spacer.

While the invention has been described in terms of the embodiments described above, those skilled in the art will recognize that the invention can be practiced with modification within the spirit and scope of the appended claims.

Having thus described my invention, what we claim as new and desire to secure by Letters Patent is as follows:

1. A method of forming an image on a substrate comprising the steps of:
    providing a first pattern of selectively etchable material on a substrate, said first pattern material having sidewalls that are substantially vertical;
    forming a first sidewall spacer on the substantially vertical sidewalls of said first pattern material, said first sidewall spacer being of a material that is selectively etchable relative to the first pattern material;
    forming a second pattern of a selectively etchable material having sidewalls that are substantially vertical, wherein the second pattern must intersect the first pattern;
    forming a second sidewall spacer on the substantially vertical sidewalls of said second pattern material, said second sidewall spacer being of a material that is selectively etchable relative to the second pattern material wherein said second sidewall spacer overlays said first sidewall spacer at an area of an intersection of said first and second patterns; and
    etching the second pattern material to leave the second sidewall spacer at said area of intersection wherein said second sidewall spacer overlays said first sidewall spacer.

2. A method as in claim 1, wherein the steps of forming the first and second sidewall spacers define first and second sub-lithographic widths.

3. A method as in claim 1, further comprising a step of planarizing the surface after forming said first sidewall spacer, with a planarizing material which can be etched selective to the first sidewall spacer.

4. A method as in claim 1, further comprising the step of etching said first sidewall spacer selective to said second sidewall spacer after etching said second pattern material.

5. A method as in claim 4, further comprising the step of etching said first pattern material to produce a contact composed of a first sidewall spacer defining a first sub-lithographic dimension along a first axis, and a second sidewall spacer formed thereon defining a second sub-lithographic dimension along a second different axis.

6. A method as in claim 1, further comprising the step of etching said first pattern material to leave said first sidewall spacer before forming said second pattern material.

7. A method as in claim 1, wherein the step of forming the second pattern material provides an overlap of the first and second pattern at an intersection, such that the first and second pattern are substantially perpendicular at said intersection.

8. A method of forming a structure comprising the steps of:
    forming a first sidewall spacer on the surface of a substrate, said first sidewall spacer extending, as a first line at least in a first region, in a first direction parallel to said surface;
    forming a second sidewall spacer, extending as a second line in at least an area within said first region in a second direction substantially perpendicular to said first direction of said first line, wherein said second line crosses said first line perpendicularly, and having a portion within said area on said first sidewall spacer; and
    processing said first sidewall spacer using said second sidewall spacer as a mask.

9. The method as recited in claim 8 wherein said substrate comprises a semiconductor.

10. The method as recited in claim 8 wherein said second sidewall spacer comprises a first edge and a second edge, a width in said first direction of said second sidewall spacer being the space therebetween, and wherein said processing step involves etching said first sidewall spacer so that said first sidewall spacer has an end defined by said first edge of said second sidewall spacer.

11. The method as recited in claim 10 wherein said processing step further involves etching said first sidewall spacer so that said first sidewall spacer has a length in said second direction defined by the width of said second sidewall spacer.

* * * * *